(12) United States Patent
Manickam et al.

(10) Patent No.: US 11,187,765 B2
(45) Date of Patent: Nov. 30, 2021

(54) APPARATUS AND METHOD FOR LOWER MAGNETOMETER DRIFT WITH INCREASED ACCURACY

(71) Applicant: LOCKHEED MARTIN CORPORATION, Bethesda, MD (US)

(72) Inventors: Arul Manickam, Mount Laurel, NJ (US); Stephen M. Alessandrini, Medford, NJ (US); Gregory Scott Bruce, Abington, PA (US); Peter G. Kaup, Marlton, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 16/134,796

(22) Filed: Sep. 18, 2018

(65) Prior Publication Data

US 2020/0088812 A1 Mar. 19, 2020

(51) Int. Cl.
*G01R 33/26* (2006.01)
*G01R 33/00* (2006.01)

(52) U.S. Cl.
CPC ......... *G01R 33/26* (2013.01); *G01R 33/0029* (2013.01)

(58) Field of Classification Search
CPC .............................. G01R 33/26; G01R 33/0029
See application file for complete search history.

(56) References Cited

U.S. PATENT DOCUMENTS

| 6,166,541 A | * | 12/2000 | Smith | G01R 33/3607 324/300 |
| 2015/0001422 A1 | * | 1/2015 | Englund | G01N 21/6458 250/459.1 |
| 2019/0178959 A1 | * | 6/2019 | Barry | G01R 33/032 |

* cited by examiner

*Primary Examiner* — Akm Zakaria
(74) *Attorney, Agent, or Firm* — Foley & Lardner LLP

(57) ABSTRACT

The present disclosure relates to apparatuses and methods for stimulating a magneto-optical defect material with defect centers in a magnetic detection system using a stimulation process to significantly increase magnetic sensitivity of the detection system. The system utilizes a Ramsey pulse sequence pair or a shifted magnetometry adapted cancellation (SMAC) pair to detect and measure the magnetic field acting on the system. Utilizing a pair of magnetic measurements that are approximately in quadrature improves the dynamic range and accuracy of the magnetic detection.

30 Claims, 13 Drawing Sheets

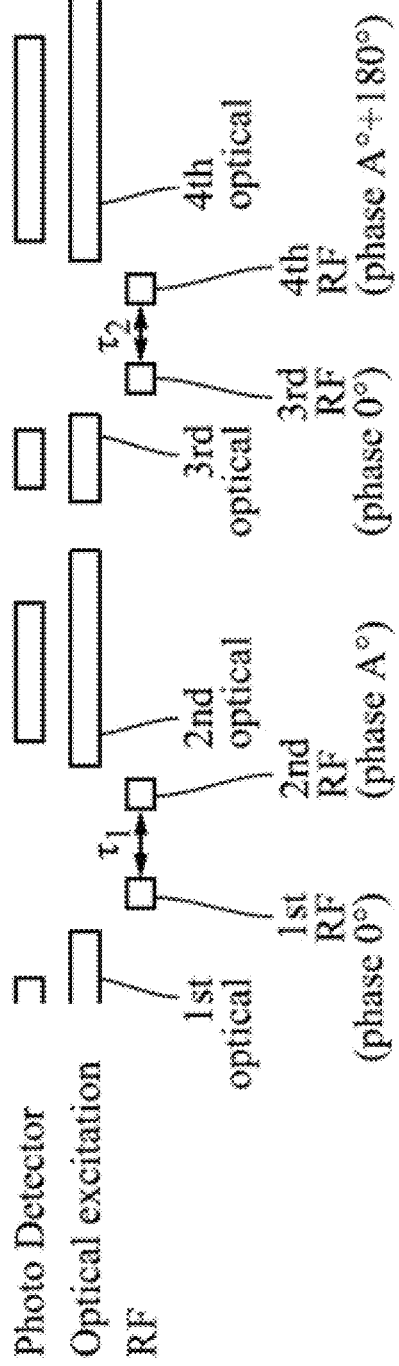
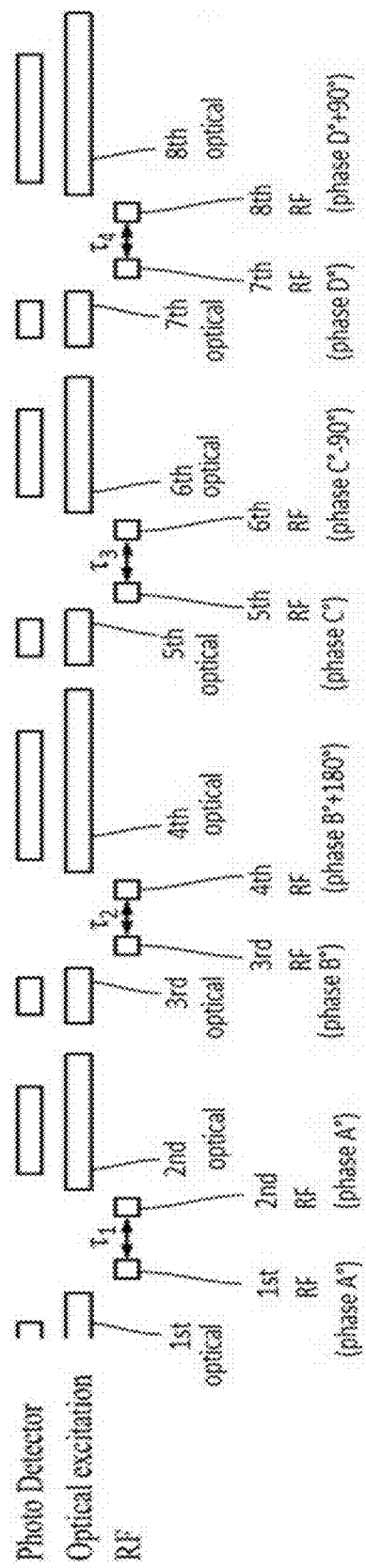
FIG. 10a
FIG. 10b

APPARATUS AND METHOD FOR LOWER MAGNETOMETER DRIFT WITH INCREASED ACCURACY

FIELD

The present disclosure relates to magnetic detection systems, and more generally, to measurement and signal processing methods for a magnetic detection system.

BACKGROUND

A number of industrial applications, as well as scientific areas such as physics and chemistry can benefit from magnetic detection and imaging with a device that has extraordinary sensitivity, ability to capture signals that fluctuate very rapidly (bandwidth) all with a substantive package that is extraordinarily small in size and efficient in power. Mobile magnetometers can encounter sources of inaccuracy under large dynamic range excursions. These errors can be significant enough to prevent use of the sensors for particular applications such as magnetic navigation.

SUMMARY

Some aspects relate to systems configured for magnetic detection using a magneto-optical defect center material comprising a plurality of defect centers. The systems may include one or more controllers configured by machine-readable instructions. The controller(s) may be configured to apply a first Ramsey pulse sequence to the magneto-optical defect center material comprising a first pair of RF excitation pulses having a first phase difference, receive a first light detection signal from an optical detector based on an optical signal emitted by the magneto-optical defect center material due to the first Ramsey pulse sequence, apply a second Ramsey pulse sequence to the magneto-optical defect center comprising a second pair of RF excitation pulses having a second phase difference, receive a second light detection signal from an optical detector based on an optical signal emitted by the magneto-optical defect center material due to the second Ramsey pulse sequence, apply a third Ramsey pulse sequence to the magneto-optical defect center material comprising a third pair of RF excitation pulses having a third phase difference, receive a third light detection signal from an optical detector based on an optical signal emitted by the magneto-optical defect center material due to the third Ramsey pulse sequence, apply a fourth Ramsey pulse sequence to the magneto-optical defect center comprising a second pair of RF excitation pulses having a fourth phase difference, receive a fourth light detection signal from an optical detector based on an optical signal emitted by the magneto-optical defect center material due to the fourth Ramsey pulse sequence, develop a first magnetometry curve as a function of a RF excitation frequency based on the first light detection signal and the second light detection signal, develop a second magnetometry curve as a function of the RF excitation frequency based on the third light detection signal and the fourth light detection signal, wherein the second magnetometry curve is roughly in quadrature to the first magnetometry curve, and provide a combined magnetometry curve based on the inverse tangent of the first magnetometry curve and the second magnetometry curve at a plurality of frequencies. In some implementations, the controller(s) may be configured to determine an external magnetic field acting on the magneto-optical defect center material based on the combined magnetometry curve.

Other aspects relate to a method for magnetic detection using a magneto-optical defect center material comprising a plurality of defect centers. The methods may include applying a first Ramsey pulse sequence to the magneto-optical defect center material comprising a first pair of RF excitation pulses having a first phase difference, receiving a first light detection signal from an optical detector based on an optical signal emitted by the magneto-optical defect center material due to the first Ramsey pulse sequence, applying a second Ramsey pulse sequence to the magneto-optical defect center comprising a second pair of RF excitation pulses having a second phase difference, receiving a second light detection signal from an optical detector based on an optical signal emitted by the magneto-optical defect center material due to the second Ramsey pulse sequence, applying a third Ramsey pulse sequence to the magneto-optical defect center material comprising a third pair of RF excitation pulses having a third phase difference, receiving a third light detection signal from an optical detector based on an optical signal emitted by the magneto-optical defect center material due to the third Ramsey pulse sequence, applying a fourth Ramsey pulse sequence to the magneto-optical defect center comprising a second pair of RF excitation pulses having a fourth phase difference, receiving a fourth light detection signal from an optical detector based on an optical signal emitted by the magneto-optical defect center material due to the fourth Ramsey pulse sequence, developing a first magnetometry curve as a function of a RF excitation frequency based on the first light detection signal and the second light detection signal, developing a second magnetometry curve as a function of the RF excitation frequency based on the third light detection signal and the fourth light detection signal, wherein the second magnetometry curve is roughly in quadrature to the first magnetometry curve, and providing a combined magnetometry curve based on the inverse tangent of the first magnetometry curve and the second magnetometry curve at a plurality of frequencies. In some implementations, the first Ramsey pulse sequence may comprise a first optical excitation pulse, the first pair of RF excitation pulses separated by a first time period, and a second optical excitation pulse to the magneto-optical defect center material, wherein the second Ramsey pulse sequence comprises a third optical excitation pulse, the second pair of RF excitation pulses separated by a second time period, and a fourth optical excitation pulse to the magneto-optical defect center material, wherein the third Ramsey pulse sequence comprises a fifth optical excitation pulse, the third pair of RF excitation pulses separated by a third time period, and a sixth optical excitation pulse to the magneto-optical defect center material, and the fourth Ramsey pulse sequence comprises a seventh optical excitation pulse, the fourth pair of RF excitation pulses separated by a fourth time period, and an eight optical excitation pulse to the magneto-optical defect center material.

Some aspects relate to a systems that may be configured for magnetic detection using a magneto-optical defect center material comprising a plurality of defect centers. The systems may include one or more controllers configured by machine-readable instructions. The controller(s) may be configured to control an optical excitation source apply a first pulse sequence comprising a first optical excitation pulse, a first pair of RF excitation pulses separated by a first time period, and a second optical excitation pulse to the magneto-optical defect center material; a second pulse sequence comprising a third optical excitation pulse, a second pair of RF excitation pulses separated by a second time period, and a fourth optical excitation pulse to the magneto-optical defect center material, wherein the pulse width of the first pair of RF excitation pulses is different than the pulse width of the second pair of RF excitation pulses, and wherein the first time period is different than the second time period; to apply a third pulse sequence comprising a fifth optical excitation pulse, a third pair of RF excitation pulses separated by a third time period, and a sixth optical excitation pulse to the magneto-optical defect center material; to apply a fourth pulse sequence comprising a seventh optical excitation pulse, a fourth pair of RF excitation pulses separated by a fourth time period, and an eighth optical excitation pulse to the magneto-optical defect center material, wherein the pulse width of the third pair of RF excitation pulses is different than the pulse width of the second pair of RF excitation pulses, and wherein the third time period is different than the fourth time period.

The controller(s) may be configured to receive a first light detection signal from the optical detector based on an optical signal emitted by the magneto-optical defect center material due to the first pulse sequence, receive a second light detection signal from the optical detector based on an optical signal emitted by the magneto-optical defect center material due to the second pulse sequence, receive a third light detection signal from the optical detector based on an optical signal emitted by the magneto-optical defect center material due to the third pulse sequence, receive a second light detection signal from the optical detector based on an optical signal emitted by the magneto-optical defect center material due to the fourth pulse sequence, provide a first magnetometry curve as a function of a RF excitation frequency based on the first light detection signal and the second light detection signal, provide a second magnetometry curve as a function of the RF excitation frequency based on the third light detection signal and the fourth light detection signal, and provide a combined magnetometry curve based on the inverse tangent of the first magnetometry curve and the second magnetometry curve at a plurality of frequencies, wherein the first magnetometry curve and second magnetometry curve is approximately in quadrature.

Other aspects relate to methods for magnetic detection using a magneto-optical defect center material comprising a plurality of defect centers. The methods may include controlling an optical excitation source and an RF excitation source to apply a first pulse sequence including a first optical excitation pulse, a first pair of RF excitation pulses separated by a first time period, and a second optical excitation pulse to the magneto-optical defect center material. The methods may include controlling the optical excitation source and the RF excitation source to apply a second pulse sequence including a third optical excitation pulse, a second pair of RF excitation pulses separated by a second time period, and a fourth optical excitation pulse to the magneto-optical defect center material. The pulse width of the first two RF excitation pulses may be different than the pulse width of the second two RF excitation pulses. The first time period may be different than the second time period. The methods may include receiving a first light detection signal from the optical detector based on an optical signal emitted by the magneto-optical defect center material due to the first pulse sequence. The methods may include receiving a second light detection signal from the optical detector based on an optical signal emitted by the magneto-optical defect center material due to the second pulse sequence. The methods may include developing a first magnetometry curve as a function of a RF excitation frequency based on the first light detection signal. The methods may include developing a second magnetometry curve as a function of the RF excitation frequency based on the second light detection signal. The methods may include providing a combined magnetometry curve based on the inverse tangent of the first magnetometry curve and the second magnetometry curve at a plurality of frequencies. The first magnetometry curve and second magnetometry curve may be approximately in quadrature.

Other aspects may relate to systems for magnetic detection. The systems may comprise a magneto-optical defect center material comprising a plurality of defect centers, a means of providing RF excitation to the magneto-optical defect center material, a means of providing optical excitation to the magneto-optical defect center material, and a means of controlling the provided RF excitation and provided optical excitation. The means of controlling the provided RF excitation and provided optical excitation may comprise means to apply a first pulse sequence to the magneto-optical defect center material using shifted magnetometry adaptive cancelation comprising a first pair of RF excitation pulses having a first phase difference and apply a second pulse sequence to the magneto-optical defect center material using shifted magnetometry adaptive cancelation comprising a second pair of RF excitation pulses having a second phase difference, the second phase difference approximately in quadrature to the first phase difference. The systems may further comprise a means of receiving an optical signal emitted by the magneto-optical defect center material to receive a first light detection signal from an optical detector based on an optical signal emitted by the magneto-optical defect center material due to the first pulse sequence and receive a second light detection signal from an optical detector based on an optical signal emitted by the magneto-optical defect center material due to the second pulse sequence. The systems may further comprise a means of developing magnetometry curves to develop a first magnetometry curve as a function of a RF excitation frequency based on the first light detection signal, develop a second magnetometry curve as a function of the RF excitation frequency based on the second light detection signal, and provide a combined magnetometry curve based on the inverse tangent of the first magnetometry curve and the second magnetometry curve at a plurality of frequencies. The systems may further comprise a means of providing a bias magnetic offset to distinguish response curves of different lattice orientation subsets of the magneto-optical defect center material. The systems may further comprise a means to determine an external magnetic field acting on the magneto-optical defect center material based on the combined magnetometry curve. The first pulse sequence may comprise a first optical excitation pulse, the first pair of RF excitation pulses separated by the first time period, and a second optical excitation pulse to the magneto-optical defect center material. The second pulse sequence may comprise a third optical excitation pulse, the second pair of RF excitation pluses separated by the second time period, and a fourth optical excitation pulse to the magneto-optical defect center material.

In some implementations, the first Ramsey pulse sequence may comprise a first optical excitation pulse, the first pair of RF excitation pulses separated by a first time period, and a second optical excitation pulse to the magneto-optical defect center material, wherein the second Ramsey pulse sequence comprises a third optical excitation pulse, the second pair of RF excitation pulses separated by a second time period, and a fourth optical excitation pulse to the magneto-optical defect center material, wherein the third Ramsey pulse sequence comprises a fifth optical excitation pulse, the third pair of RF excitation pulses separated by a third time period, and a sixth optical excitation pulse to the magneto-optical defect center material, and wherein the fourth Ramsey pulse sequence comprises a seventh optical excitation pulse, the fourth pair of RF excitation pulses separated by a fourth time period, and an eight optical excitation pulse to the magneto-optical defect center material. In some implementations, the Ramsey pulse sequences use shifted magnetometry adaptive cancelation. wherein the first pair of RF excitation pulses is applied followed by the second pair of RF excitation pulses followed by the third pair of RF excitation pulse followed by the fourth pair of RF excitation pulses. In some implementations, the first and second RF excitation pulses have a first phase difference of 0° and the third and fourth RF excitation pulses have a second phase difference of 180°. In some implementations, the fifth and sixth RF excitation pulses have a third phase difference of −90° and the seventh and eighth RF excitation pulses have a fourth phase difference of 90°. In some implementations, a difference between the second phase difference and the first phase difference is 180°, a difference between the fourth phase difference and the third phase difference is 180°, and the two differences are roughly in quadrature.

Other aspects relate to a non-transient computer-readable storage medium having instructions embodied thereon, the instructions being executable by a controller to perform any of the methods described above.

BRIEF DESCRIPTION OF THE DRAWINGS

FIG. 10a is a schematic illustrating a Ramsey pulse sequence for shifted magnetometry adaptive cancelation (SMAC) according to some implementations.

FIG. 10b is a schematic illustrating a Ramsey pulse sequence for dual SMAC according to some implementations.

DETAILED DESCRIPTION

Figure 2:
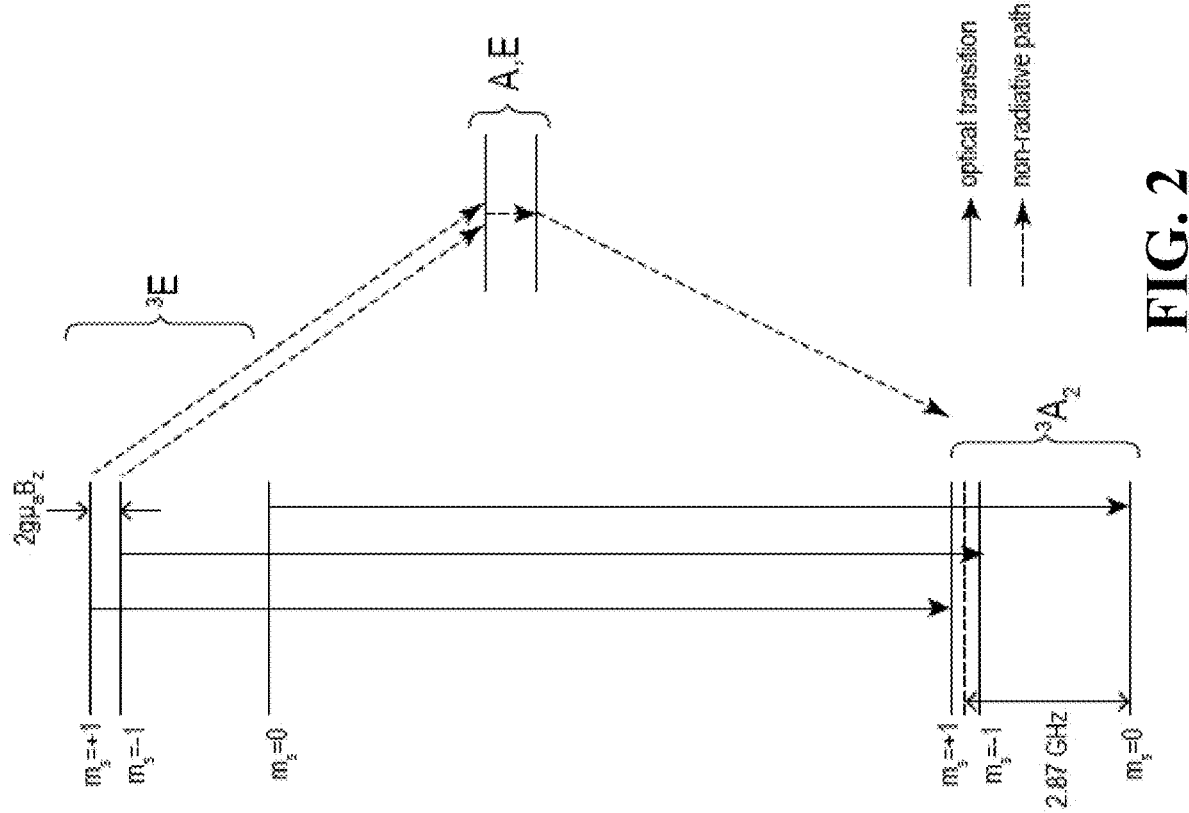
FIG. 2 illustrates an energy level diagram showing energy levels of spin states for a defect center in accordance with some illustrative implementations.

In the following detailed description, reference is made to the accompanying drawings, which form a part hereof. In the drawings, similar symbols typically identify similar components, unless context indicates otherwise. The illustrative implementations described in the detailed description, drawings, and claims are not meant to be limiting. Other implementations may be utilized, and other changes may be made, without departing from the spirit or scope of the subject matter presented. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Magneto-optical defect center materials such as diamonds with nitrogen vacancy (NV) centers can be used to detect magnetic fields. Atomic-sized nitrogen-vacancy (NV) centers in diamond lattices can have excellent sensitivity for magnetic field measurement and can enable fabrication of small magnetic sensors. The sensing capabilities of diamond NV (DNV) sensors may be maintained at room temperature and atmospheric pressure and these sensors can be even used in liquid environments. It should be understood that the techniques described in this document are not limited to DNV magnetometry and, in some implementations, may be used in other magnetometry. For example, the techniques described in this document may be used with nuclear magnetic resonance (NMR) magnetometry. In another example, the techniques described in this document may be used with electron spin resonance (ESR) magnetometry.

Excitation light, such as green light, which enters a diamond structure with defect centers interacts with defect centers, and fluorescent light, which is red, is emitted from the diamond. The intensity of red light emitted can be used to determine the strength and direction of the magnetic field. The efficiency and accuracy of sensors using magneto-optical defect center materials such as diamonds with NV centers (generally, DNV sensors) is increased by transferring as much light as possible from the defect centers to the photo sensor that measures the amount of red light. Magneto-optical defect center materials include but are not limited to diamonds, Silicon Carbide (SiC) and other materials with nitrogen, boron, or other chemical defect centers.

Mobile magnetometers, such as mobile DNV vector magnetometers, can encounter sources of inaccuracy under large dynamic range excursions. These errors can be significant enough to prevent use of the sensors for particular applications such as magnetic navigation. In some implementations, using a joint measurement from two magnetometry curves, where the two magnetometry curves are roughly in quadrature (i.e., one is cosine-like and the other is sine-like) can help mitigate these sources of inaccuracy.

Some sources of inaccuracy in mobile magnetometers, such as mobile DNV vector magnetometers, may include gain changes in the receive path (e.g., photodetector gain) that causes a scaling of the data, and would appear as drift and/or inaccuracy if uncompensated for. Another source of inaccuracy may be dynamic range extension via RF jumping, which causes errors when switching RF frequency due to limited NV response rate and errors in the estimate of the magnetometry curve. Another source of inaccuracy may be due to the limited number of samples that can be taken when estimating a reference magnetometry curve such that even small fit errors cause large inaccuracies. Another source of inaccuracy may be the instantaneous dynamic range for RF jumping being limited by the rate of the feedback loop such that untracked sudden large changes in the background magnetic field measurement may result in an ambiguity and prevention of correct sensor function.

Using a joint measurement from two magnetometry curves, where the two magnetometry curves are roughly in quadrature can help the system be resilient to gain changes. For example, gain changes in a photodetector due to temperature change may apply equally to the two magnetometry curves and therefore the angle between the two measurements will not change making the joint measurement resilient to the gain changes. The joint measurement from the two magnetometry curves may also result in a much larger dynamic range. A potential loss of sensitivity further away from the center of the magnetometry curve may be compensated for and reduced by also using an RF window. In addition, since the reference magnetometry curve shape may be estimated from a finite number of sample points in a limited sampling time, interpolation may be used between sample points to get an estimate of the curve shape. Where there is higher curvature there may be more error in the interpolation. Certain functionality (e.g., magnetic navigation) may be more sensitive to interpolation errors of this nature. The joint measurement has much less curvature and may therefore exhibit less interpolation error.

In some implementations, the system utilizes a special Ramsey pulse sequence pair or a 'shifted magnetometry adapted cancellation' (SMAC) pair to detect and measure the magnetic field acting on the system. These parameters include the resonant Rabi frequency, the free precession time (tau), the RF pulse width, and the detuning frequency, all of which help improve the sensitivity of the measurement. For a SMAC pair measurement, two different values of tau are used as well as two different values of the pulse width for each measurement of the pair. In some implementations, two different phases on the second pulse are used. This is in contrast to Ramsey excitation measurement where a single pulse sequence is repeated in which there may be repolarization of the system, double RF pulses separated by a gap for the free precession time, a start of the optical excitation and a readout during the optical excitation. In a SMAC excitation, there is a second set of RF pulses having a pulse width and tau values which may be different from the pulse width and tau of the first set. The first set of RF pulses is done with the first set of values, there is repolarization of the system, and then the second set of values is used to create an inverted curve. The SMAC pair estimate is a combination of the magnetometry curves of the two pulse sequences with different values. In some implementations, the combination is the difference between the two curves. This creates a magnetometry curve that is resilient to vertical offset errors. In some implementations, the magnetometry curve has an improved slope and improved performance.

In some implementations, using the SMAC technique or SMAC pair measurement to perform a differential measurement technique, low-frequency noise such as vibrations, laser drift, low-frequency noise in the receiver circuits, residual signals from previous measurements (e.g., from previous measurements on other lattice vectors), and the like get canceled out through the differential measurement technique. In some implementations, this may provide a sensitivity increase at lower frequencies where colored noise may be the strongest. In some implementations, the low-frequency noise cancelation may be due to slowly varying noise in the time domain appearing almost identically in the two sequential sets of Ramsey measurements in the SMAC pair measurement. In some implementations, inverting the second Ramsey set and subtracting the measurement from the first Ramsey set may largely cancel out any noise that is added post-inversion. Inverting the second Ramsey set and then subtracting its measurement off from the first may therefore largely cancel out any noise that is added post-inversion. In some implementations, the low frequency noise cancelation may be due to regarding the SMAC technique as a digital modulation technique, whereby, in the frequency domain, the magnetic signals of interest are modulated up to a carrier frequency of half the sampling rate (inverting every second set of Ramsey measurements is equivalent to multiplying the signal by $e^{j\pi n}$ where n is the sample (i.e., Ramsey pulse number). In some implementations, this may shift the magnetic signals of interest to a higher frequency band that is separated from the low-frequency colored noise region. Then, a high-pass filter may be applied to the signal to remove the noise, and finally, the signal may be shifted back to baseband. In some implementations, performing a differential measurement may be equivalent to a two-tap high-pass filter, followed by a 2× down-sampling. In some implementations, higher-order filters may be used to provide more out-of-band noise rejection to leave more bandwidth for the signal of interest.

Figure 1:
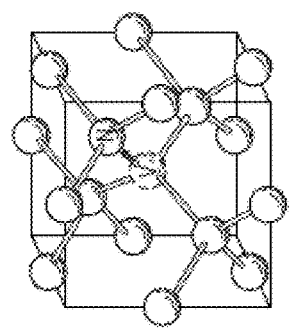
FIG. 1 illustrates a defect center in a diamond lattice in accordance with some illustrative implementations.

The defect center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. Conventionally, the neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm1$ energy levels are offset from the $m_s=0$ due to spin-spin interactions, and the $m_s=\pm1$ energy levels are degenerate, i.e., they have the same energy. The $m_s=0$ spin state energy level is split from the $m_s=\pm 1$ energy levels by an energy of 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount $2g\mu_B Bz$, where g is the g-factor, $\mu_B$ is the Bohr magneton, and Bz is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

Figure 3:
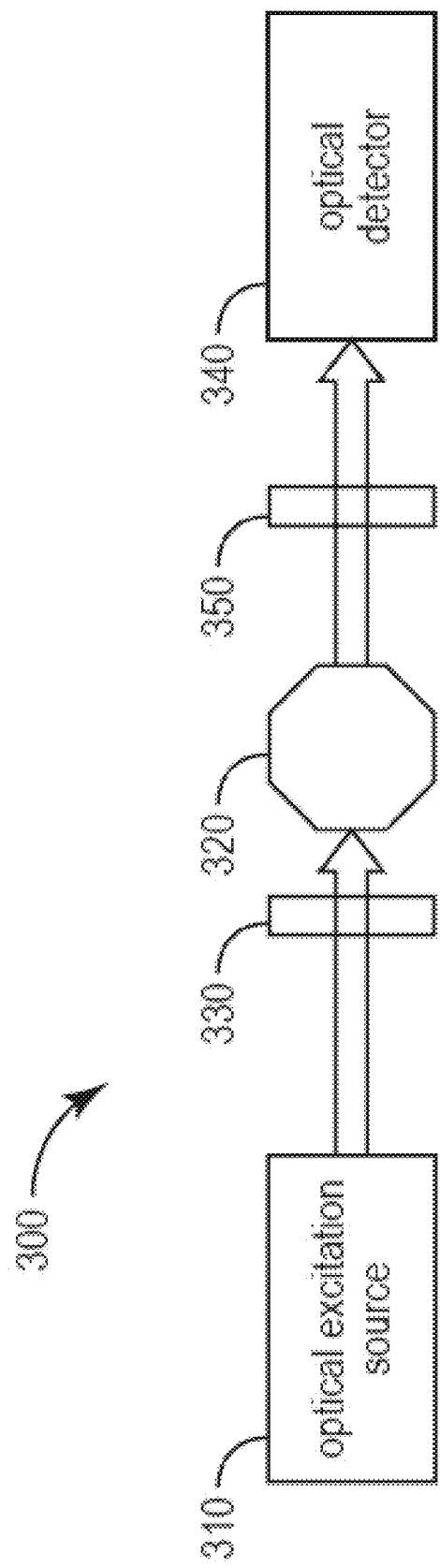
FIG. 3 is a schematic diagram illustrating a defect center magnetic sensor system in accordance with some illustrative implementations.

FIG. 3 is a schematic diagram illustrating a magneto-optical defect center magnetic sensor system 300 that uses fluorescence intensity to distinguish the $ms=\pm 1$ states, and to measure the magnetic field based on the energy difference between the $ms=+1$ state and the $ms=-1$ state. The system 300 includes an optical excitation source 310, which directs optical excitation to a magneto-optical defect center material 320 with defect centers (e.g, NV diamond material). The system further includes an RF excitation source 330, which provides RF radiation to the magneto-optical defect center material 320. Light from the NV diamond may be directed through an optical filter 350 to an optical detector 340.

In some implementations, the RF excitation source 330 may be a microwave coil. A microwave coil is a non-limiting example, and other RF excitation sources may be used, including strip line emitters and the like. The RF excitation source 330, when emitting RF radiation with a photon energy resonant with the transition energy between ground ms=0 spin state and the ms=+1 spin state, excites a transition between those spin states. For such a resonance, the spin state cycles between ground ms=0 spin state and the ms=+1 spin state, reducing the population in the ms=0 spin state and reducing the overall fluorescence at resonances. Similarly, resonance occurs between the ms=0 spin state and the ms=−1 spin state of the ground state when the photon energy of the RF radiation emitted by the RF excitation source is the difference in energies of the ms=0 spin state and the ms=−1 spin state, or between the ms=0 spin state and the ms=+1 spin state, there is a decrease in the fluorescence intensity.

In some implementations, the optical excitation source 310 may be a laser or a light emitting diode which emits light in the green. In some implementations, the optical excitation source 310 induces fluorescence in the red, which corresponds to an electronic transition from the excited state to the ground state. In some implementations, light from the magneto-optical defect center material 320 is directed through the optical filter 350 to filter out light in the excitation band (in the green, for example), and to pass light in the red fluorescence band, which in turn is detected by the detector 340. The optical excitation light source 310, in addition to exciting fluorescence in the diamond material 320, also serves to reset the population of the ms=0 spin state of the ground state 3A2 to a maximum polarization, or other desired polarization.

Figure 4:
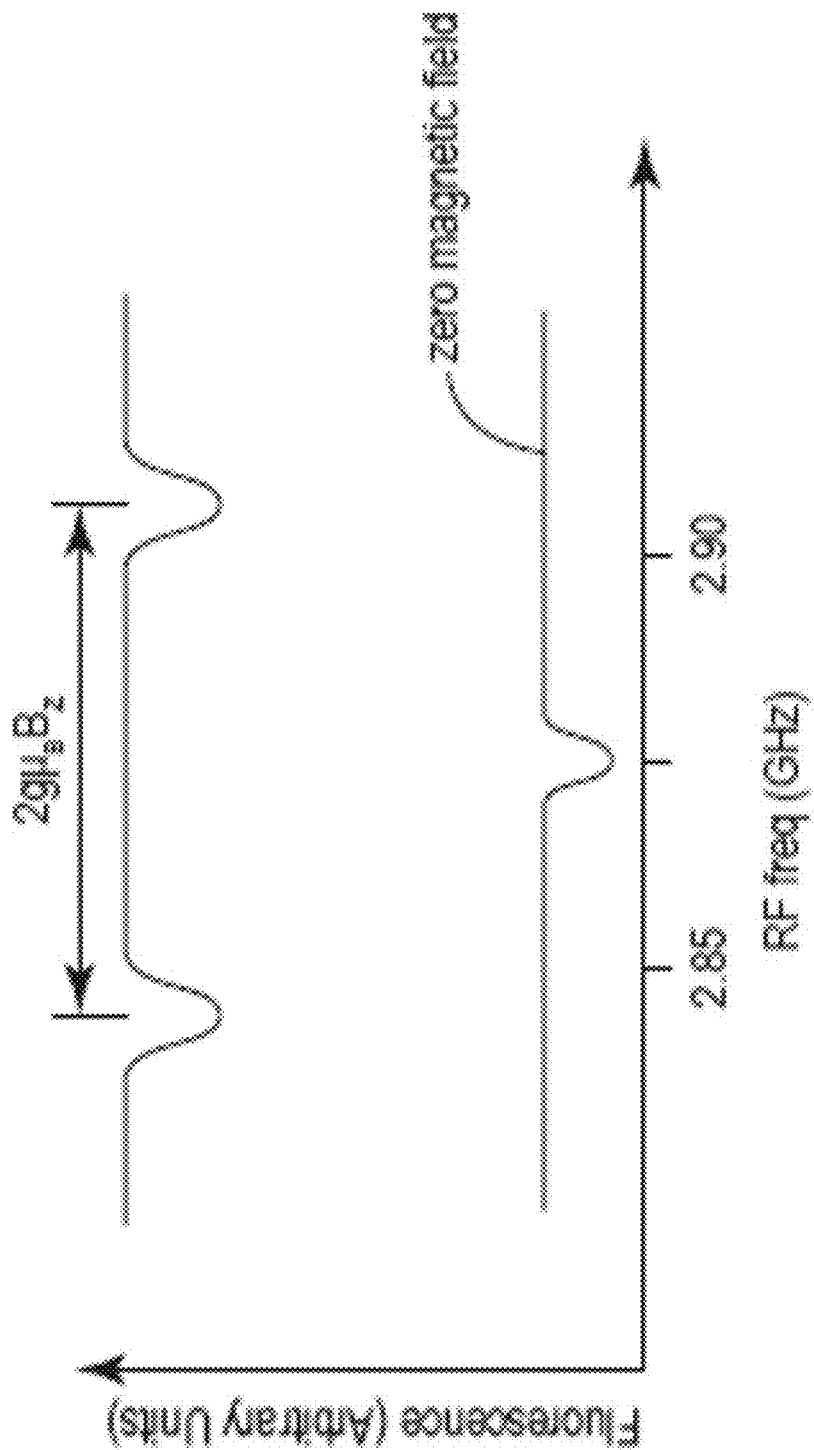
FIG. 4 is a graph illustrating the fluorescence as a function of an applied RF frequency of a defect center along a given direction for a zero magnetic field in accordance with some illustrative implementations.

For continuous wave excitation, the optical excitation source 310 continuously pumps the magneto-optical defect centers, and the RF excitation source 330 sweeps across a frequency range that includes the zero splitting (when the $m_s=\pm 1$ spin states have the same energy) photon energy of 2.87 GHz. The fluorescence for an RF sweep corresponding to a magneto-optical defect center material 320 with magneto-optical defect centers aligned along a single direction is shown in FIG. 4 for different magnetic field components Bz along the defect center axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence (described in more detail below), and spin echo pulse sequence. It should be understood that the techniques discussed in this document are not limited to Ramsey pulse sequences but can also be applied to other sequences and techniques such as spin echo (Hahn echo) and CPMG sequences. In general, they may be applied to any magnetometry pulse sequence comprising more than one pulse. For dual SMAC, as discussed below, the phase shift may be applied to the last pulse in each sequence. For example, for Ramsey pulse sequence, the phase shift may be applied for every second pulse. In another example, for sequences using Hahn echo, the phase shift may be applied for every third pulse.

For continuous wave excitation, the optical excitation source 310 may continuously pump the defect centers, and the RF excitation source 330 may sweep across a frequency range that includes the zero splitting (when the ms=±1 spin states have the same energy) photon energy of 2.87 GHz. The fluorescence for an RF sweep corresponding to a magneto-optical defect center material 320 with defect centers aligned along a single direction for different magnetic field components Bz along the defect center axis, where the energy splitting between the ms=−1 spin state and the ms=+1 spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence. The excitation scheme utilized during the measurement collection process (i.e., the applied optical excitation and the applied RF excitation) may be any appropriate excitation scheme. For example, the excitation scheme may utilize continuous wave (CW) magnetometry, pulsed magnetometry, and variations on CW and pulsed magnetometry (e.g., pulsed RF excitation with CW optical excitation). In cases where Ramsey pulse RF sequences are used, pulse parameters $\pi$ and $\tau$ may be determined as described in, for example, U.S. patent application Ser. No. 15/003,590, which is incorporated by reference herein in its entirety.

Figure 5:
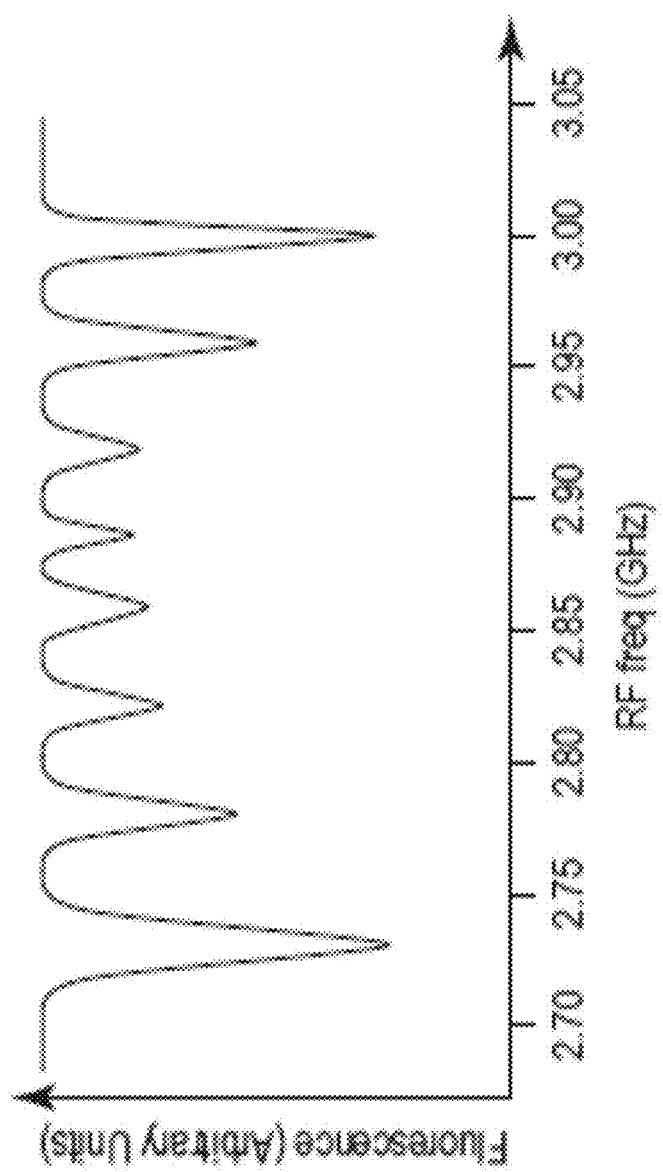
FIG. 5 is a graph illustrating the fluorescence as a function of an applied RF frequency for four different defect center orientations for a non-zero magnetic field in accordance with some illustrative implementations.

In general, the magneto-optical defect center material 320 has defect centers aligned along directions of four different orientation classes. FIG. 5 illustrates fluorescence as a function of RF frequency for the case where the magneto-optical defect center material m320 has defect centers aligned along directions of four different orientation classes. In this case, the component Bz along each of the different orientations may be determined. These results, along with the known orientation of crystallographic planes of a magneto-optical defect center material lattice, allow not only the magnitude of the external magnetic field to be determined, but also the direction of the magnetic field.

In general, the magnetic sensor system may employ a variety of different magneto-optical defect center material, with a variety of magneto-optical defect centers. Magneto-optical defect center materials include but are not be limited to diamonds, Silicon Carbide (SiC) and other materials with nitrogen, boron, or other defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
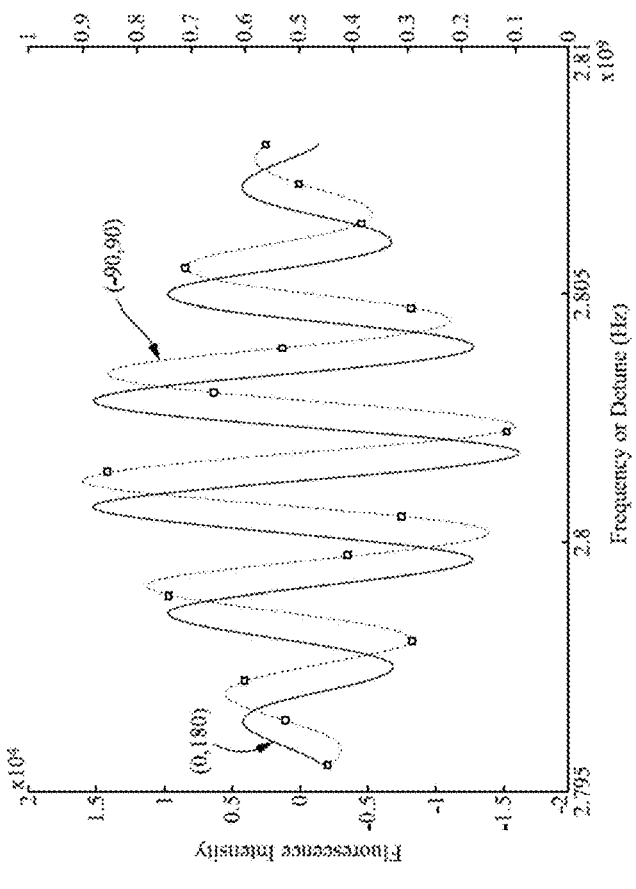
FIG. 6 is a pair of graphs illustrating a combined magnetometry curve derived from the difference of two traditional magnetometry curves and two different combined magnetometry curves in accordance with some illustrative implementations.
Figure 6:
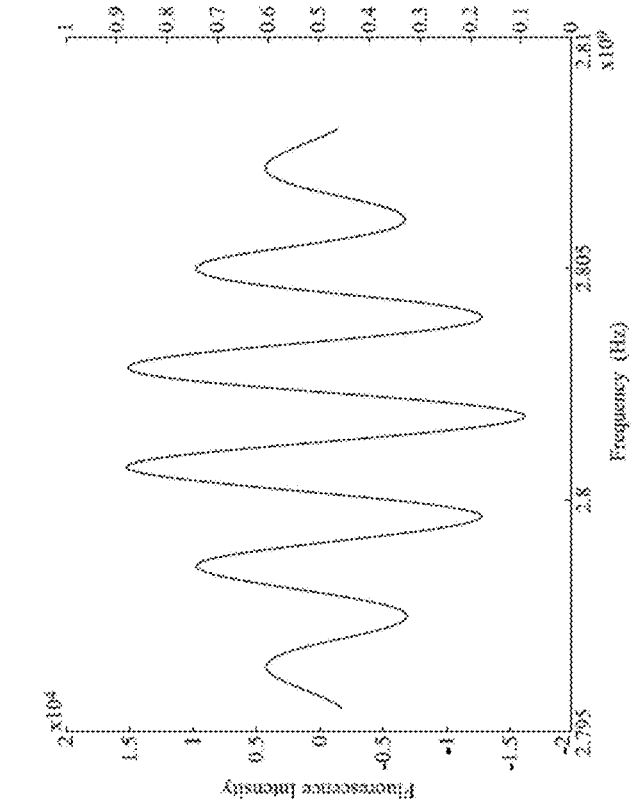

Continuing with FIG. 6, a pair of graphs illustrating a combined magnetometry curve derived from the difference of two traditional magnetometry curves and two different combined magnetometry curves is shown in accordance with some implementations. The graph on the left illustrates a combined magnetometry curve, where two magnetometry curves are combined using a SMAC technique. The curves may be combined by combining the intensities at each frequency value, such as for example, by taking the difference between intensities at each frequency value. The graph on the right illustrates a combined magnetometry curve corresponding to a difference between the magnetometry curve where third and fourth RF excitation pulses have a phase difference of 180° and the magnetometry curve where the first and second RF excitation pulses have a phase difference of 0°. The curves are combined by combining the intensities at each frequency value, such as for example, by taking the difference between intensities at each frequency value. For example, one of the combined magnetometry curves may be the combined magnetometry curve from the left graph where the phase difference in the first pair of RF excitation pulses is 0° and the phase difference in the second pair of RF excitation pulses is 180°. This combined magnetometry curve is thus designated as (0, 180), where the first number in parenthesis is the phase difference between the first and second excitation pulses, and the second number in parenthesis is the phase difference between the third and fourth excitation pulses. The other of the combined magnetometry curves may be for the case where the phase difference in the first pair of RF excitation pulses is −90° and the phase difference in the second pair of RF excitation pulses is 90°. This combined magnetometry curve is thus designated as (−90, 90).

Figure 7:
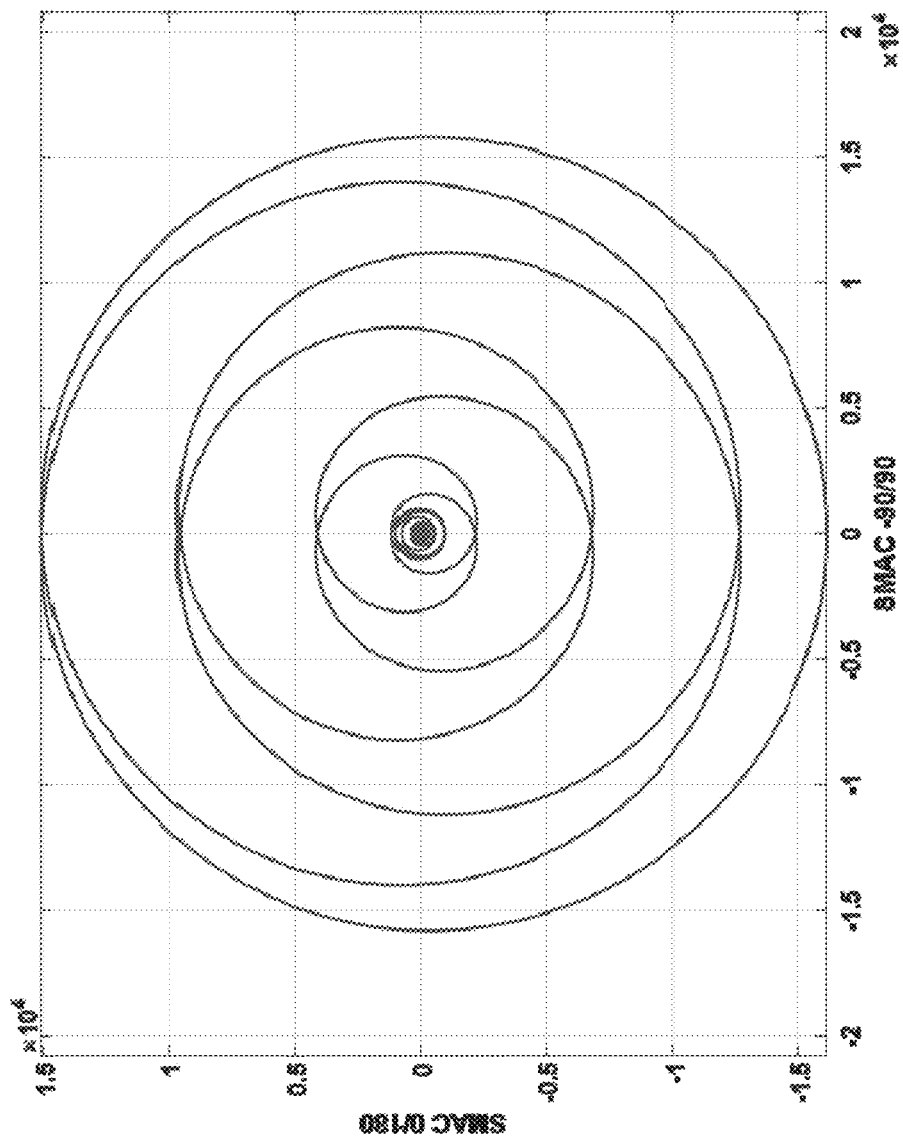
FIG. 7 is a graph illustrating a pair of measurements at each point in time with one measurement from a first combined magnetometry curve and the other measurement from a second combined magnetometry curve in accordance with some illustrative implementations.

Continuing with FIG. 7, a graph illustrating a pair of measurements at each point in time with one measurement from a first combined magnetometry curve and the other measurement from a second combined magnetometry curve is shown in accordance with some illustrative implementations. As is shown in the graph, the x axis comprises the intensities of the magnetometry curve thus designated as (−90,90) and the y axis comprises the intensities of the magnetometry curve designated as (0, 180), where since the two curves are roughly in quadrature to each other plotting them against each other results in this illustration of diminishing quasi-circles.

Figure 8:
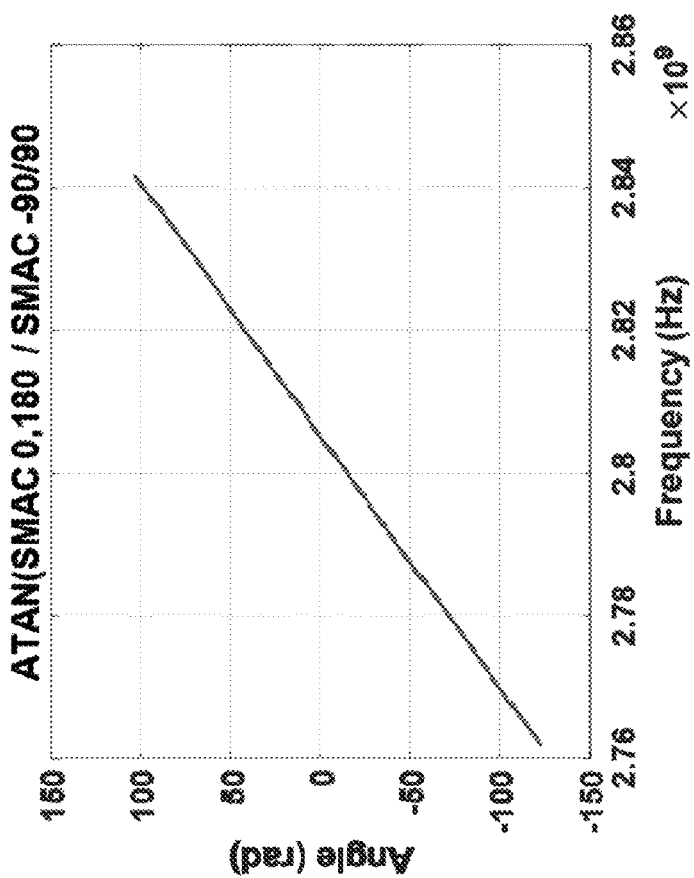
FIG. 8 is a graph illustrating the inverse tangent of each pair of measurements at each point in time of FIG. 7.

Continuing with FIG. 8, a graph illustrating the inverse tangent of each pair of measurements at each point in time of FIG. 7 is shown in accordance with some illustrative implementations. As is shown in the graph, the graph interpolates to something close to a straight line upon graphing the inverse tangent of a series of frequency points of the magnetometry curve designated as (−90,90) and the magnetometry curve designated as (0, 180), where Angle=arctangent ((0, 180)/(−90,90)). The curve shown in FIG. 8 may be resilient against gain changes.

Figure 9:
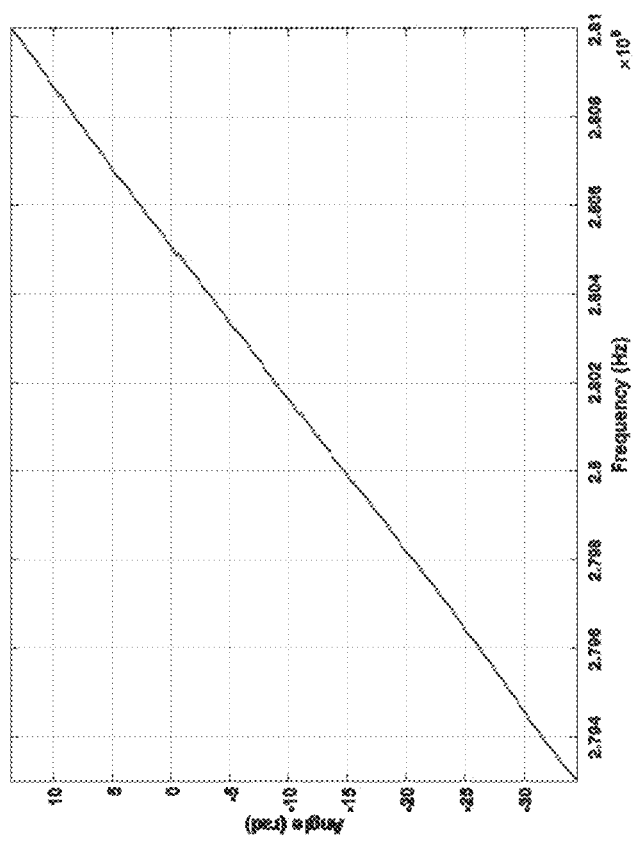
FIG. 9 is a pair of graphs illustrating the effect of interpolation error of two versions of the magnetometry curves in accordance with some illustrative implementations.
Figure 9:
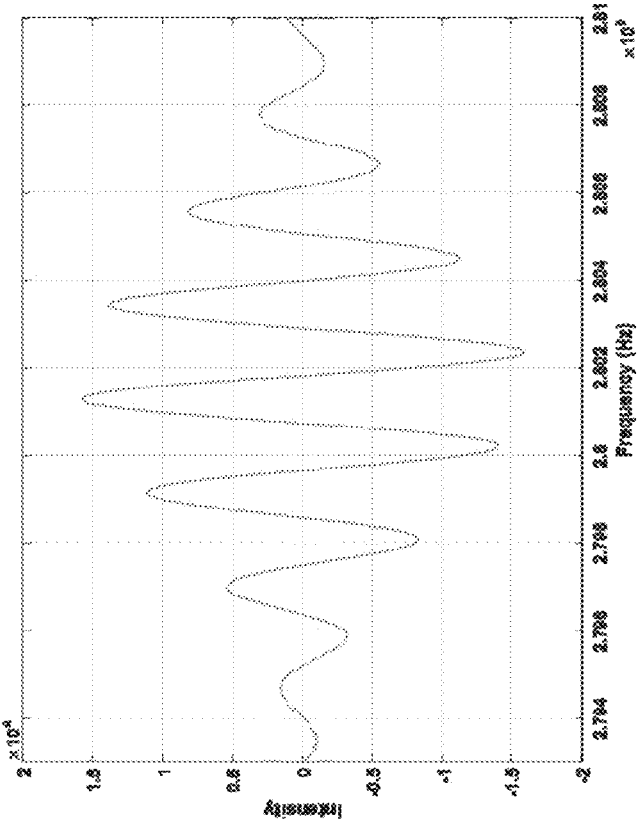

Continuing with FIG. 9, a pair of graphs illustrating the effect of interpolation error of two versions of the magnetometry curves is shown in accordance with some illustrative implementations. Since the reference magnetometry curve shape must be estimated from a finite number of sample points in a limited sampling time, interpolation may be used between sample points to get an estimate of the curve shape. Higher curvature in the curve shapes may lead to more error in interpolation. The dual magnetometry curve illustrates the resultant less curvature of the technique and therefore less interpolation error in the dual magnetometry curve versus the single magnetometry curve.

The SMAC technique may be accomplished in different ways. For example, Ramsey pulse sequence is a pulsed RF scheme that is believed to measure the free precession of the magnetic moment of spin states in a magnetic field. FIGS. 10a and 10b are schematics illustrating Ramsey pulse sequences according so some implementations using pairs of phase shifted RF pulses, where the pairs have a different relative phase shift. FIGS. 10a and 10b illustrate the timing for optical excitation by an optical excitation source, such as a laser, photodetection of fluorescence intensity from the light emitted by the magneto-optical defect center material, and RF pulses. FIG. 10a illustrates two pulse sequences, for example. More than two pulse sequences may also be used as illustrated in FIG. 10b.

As shown in FIG. 10a, an exemplary Ramsey pulse sequence for SMAC includes optical excitation pulses (e.g., from a laser) and RF excitation pulses over a first pulse sequence and then over a second pulse sequence. A first optical excitation pulse may be applied to the system to optically pump electrons into the ground state (i.e., ms=0 spin state). This may be followed by a first RF excitation pulse having a pulse width. The first RF excitation pulse may set the system into a superposition of the ms=0 and ms=+1 spin states (or, alternatively, the ms=0 and ms=−1 spin states, depending on the choice of resonance location). Following the first RF excitation pulse, the spins are allowed to freely precess (and dephase) over a time period $\tau_1$. During this free precession time period, the system precesses in the local magnetic field at a rate proportional to the magnetic field and serves as a coherent integration. Next, a second RF excitation pulse may be applied to project the system back to the ms=0 and ms=+1 basis (or, alternatively, the ms=0 and ms=−1 spin states, depending on the choice of resonance location). The pulse width of the first and second RF excitation pulses may be the same, for example. Finally, a second optical pulse may be applied to optically sample the system and a measurement basis may be obtained by detecting the fluorescence intensity from the magneto-optical defect center material.

The first and second RF excitation pulses may have a phase difference with respect to each other. The phase for each of the first and second RF excitation pulses may be set by the controller. The controller may include a digital phase shifter for controlling the phase of the excitation pulses.

Continuing with FIG. 10a, a second pair of RF excitation pulses may be provided which has a different phase shift between the RF excitation pulses than for the first pair of RF excitation pulses. In FIG. 10a, a second Ramsey pulse sequence includes a third optical excitation pulse applied to the system to optically pump electrons into the ground state (i.e., ms=0 spin state). This may be followed by a third RF excitation pulse having a pulse width. The third RF excitation pulse may again set the system into superposition of the ms=0 and ms=+1 spin states (or, alternatively, the ms=0 and ms=−1 spin states, depending on the choice of resonance location). The spins are allowed to freely precess (and dephase) over a time period $T_2$. During this free precession time period, the system precesses in the local magnetic field at a rate proportional to the magnetic field and serves as a coherent integration. Next, a fourth RF excitation pulse may be applied to project the system back to the ms=0 and ms=+1 basis. The pulse width of the third and fourth RF excitation pulses may be the same, for example. Finally, a fourth optical pulse may be applied to optically sample the system and a measurement basis may be obtained by detecting the fluorescence intensity of the system.

As shown in FIG. 10a, the first and second RF excitation pulses, for example, have a phase of 0° and A°, respectively. Thus, the first and second RF excitation pulses have a first phase difference of A°. Further, the third and fourth RF excitation pulses, for example, have a phase of 0° and (A+180°), respectively. Thus, the third and fourth RF excitation pulses have a phase difference of (A+180°). In this case, the second phase difference may be different from the first phase difference, and the difference between the second phase difference and the first phase difference may exemplarily be about 180°. Alternatively, the difference between the second phase difference and the first phase difference may be other than about 180°.

As shown in FIG. 10b, an exemplary Ramsey pulse sequence for dual SMAC includes optical excitation pulses (e.g., from a laser) and RF excitation pulses over a first pulse sequence, over a second pulse sequence, over a third pulse sequence, and then over a fourth pulse sequence.

The first, second, third, and fourth RF excitation pulses may have a phase difference with respect to each other. The phase for each of the first, second, third, and fourth RF excitation pulses may be set by the controller. The controller may include a digital phase shifter for controlling the phase of the excitation pulses.

Continuing with FIG. 10b, a second pair of RF excitation pulses may be provided which has a different phase shift between the RF excitation pulses than for the first pair of RF excitation pulses. In FIG. 10b, a second Ramsey pulse sequence includes a third optical excitation pulse applied to the system to optically pump electrons into the ground state (i.e., ms=0 spin state). This may be followed by a third RF excitation pulse having a pulse width. The third RF excitation pulse may again set the system into superposition of the ms=0 and ms=+1 spin states (or, alternatively, the ms=0 and ms=−1 spin states, depending on the choice of resonance location). The spins are allowed to freely precess (and dephase) over a time period $\tau_2$. During this free precession time period, the system precesses in the local magnetic field at a rate proportional to the magnetic field and serves as a coherent integration. Next, a fourth RF excitation pulse may be applied to project the system back to the ms=0 and ms=+1 basis. This entire process can then be repeated for another pair of Ramsey pulse sequences to include a fifth optical excitation pulse followed by a fifth RF excitation pulse and sixth RF excitation pulse with a phase shift between the RF excitation pulses and the spins allowed to freely precess over a time period τ3. A sixth optical excitation pulse is followed by a seventh RF excitation pulse and eighth RF excitation pulse with a phase shift between the RF excitation pulses and the spins allowed to freely precess over a time period τ4.

As shown in FIG. 10b, the first and second RF excitation pulses, for example, have a phase of A° and A°, respectively. Thus, the first and second RF excitation pulses have a first phase difference of 0°. Further, the third and fourth RF excitation pulses, for example, have a phase of B° and (B°+180°), respectively. Thus, the third and fourth RF excitation pulses have a phase difference of 180°. In this case, the second phase difference may be different from the first phase difference, and the difference between the second phase difference and the first phase difference may exemplarily be about 180°. Alternatively, the difference between the second phase difference and the first phase difference may be other than about 180°. Further, the fifth and sixth RF excitation pulses, for example, have a phase of C° and (C°−90°), respectively. Thus, the fifth and sixth RF excitation pulses have a third phase difference of 90°. Further, the seventh and eighth RF excitation pulses, for example, have a phase of D° and (D°+90°), respectively. Thus, the seventh and eight RF excitation pulses have a phase difference of 90°. In this case, the fourth phase difference may be different from the third phase difference, and the difference between the fourth phase difference and the third phase difference may exemplarily be about 180° and roughly in quadrature with the difference between the second phase difference and the first phase difference. Alternatively, the difference between the fourth phase difference and the third phase difference may be other than about 180°, but still roughly in quadrature with the difference between the second phase difference and the first phase difference. In different implementations, A, B, C, and D can be different values. Valid dual SMAC pulse sequences can be various permutations of the pulse sequences {1, 2, 3, 4} described above, for example where 1 comprises the first and second RF excitation pulses, 2 comprises the third and fourth RF excitation pulses and so on.

Figure 11:
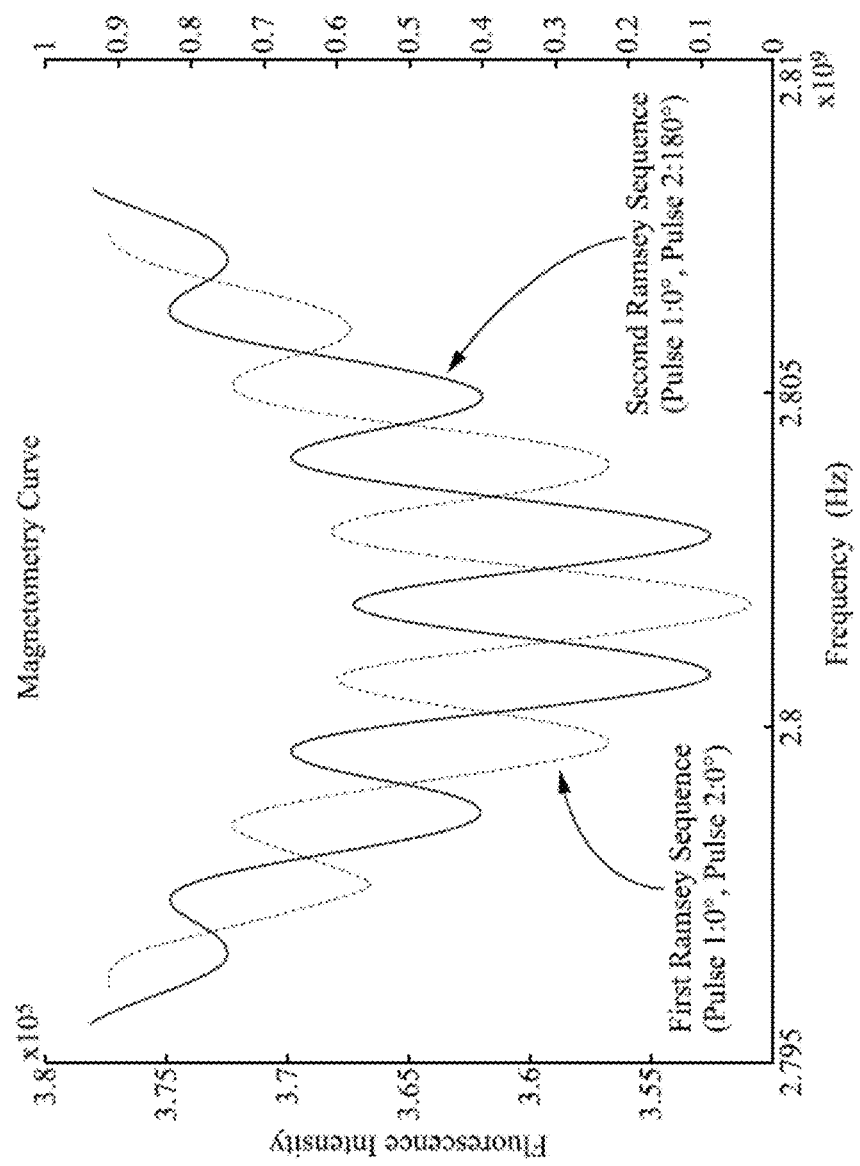
FIG. 11 is a graph illustrating two different resulting magnetometry curves from Ramsey pulse sequences in accordance with some illustrative implementations.

FIG. 11 depicts a plot of a magnetometry curve using Ramsey sequences in accordance with some implementations, and in particular in accordance with the sequence of FIG. 10a. The y-axis of the plot may be the measured fluorescence intensity from the magneto-optical defect material which may be detected, and the x-axis of the plot may be the frequency of the RF excitation pulses. The magnetometry curve may be due to the constructive/destructive interference of the three sinusoids that correspond to the hyperfine splitting in addition to side lobes caused by the Ramsey pulse.

FIG. 11 illustrates two magnetometry curves. One of the magnetometry curves may be for a Ramsey sequence in the case where first and second RF excitation pulses have a phase of 0° and 0° (A=0), respectively. Another of the magnetometry curves may be for a Ramsey sequence in the case where the third and fourth RF excitation pulses have a phase of 0° and 180° (A=0), respectively. Thus, the first and second RF excitation pulses have a first phase difference of 0° and the third and fourth RF excitation pulses have a second phase difference of 180°. In this case, the difference between the second phase difference and the first phase difference is 180°.

Figure 12:
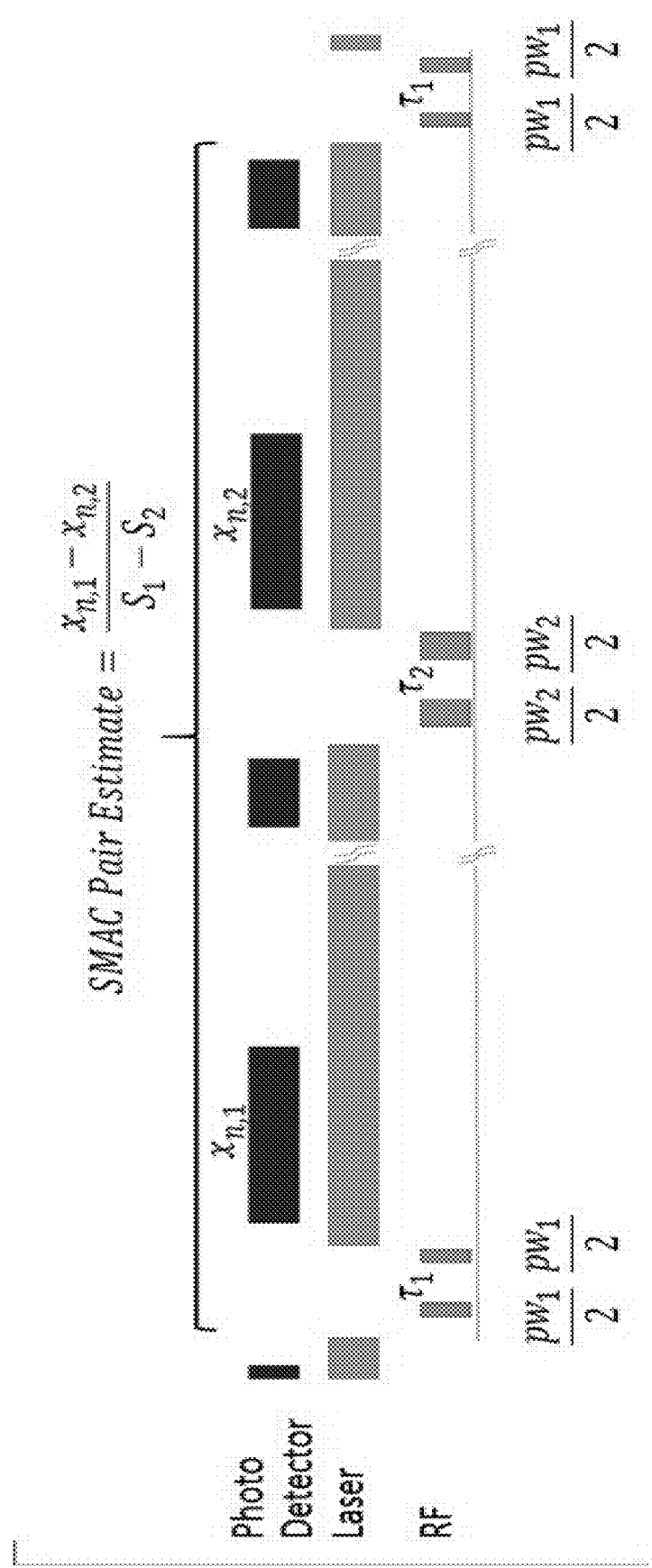
FIG. 12 is a schematic illustrating a Ramsey sequence of optical excitation pulses varying a free precession time $\tau$ and RF excitation pulses according to an operation of the system in some implementations.

Continuing with FIG. 12, illustrating a different sequence to create a SMAC pair, a second Ramsey pulse sequence includes a third optical excitation pulse applied to the system to optically pump electrons into the ground state (i.e., ms=0 spin state). This is followed by a third RF excitation pulse (in the form of, for example, a second MW pulse width/2 (pw$_2$/2)). The third RF excitation pulse may again set the system into superposition of the ms=0 and ms=+1 spin states (or, alternatively, the ms=0 and ms=−1 spin states, depending on the choice of resonance location). The spins are allowed to freely precess (and dephase) over a time period referred to as tau$_2$ ($\tau_2$). During this free precession time period, the system measures the local magnetic field and serves as a coherent integration. Next, a fourth RF excitation pulse (in the form of, for example, a MW pw$_2$/2 pulse) is applied to project the system back to the ms=0 and ms=+1 basis. Finally, a fourth optical pulse is applied to optically sample the system and a measurement basis is obtained by detecting the fluorescence intensity of the system. FIG. 12 depicts the pulse sequences continuing with another sequence with pw$_1$.

In some implementations, a reference signal may be determined by using a reference signal acquisition prior to the RF pulse excitation sequence and measured signal acquisition. A contrast measurement between the measured signal and the reference signal for a given pulsed sequence is then computed as a difference between a processed read-out fluorescence level from the measured signal acquisition and a processed reference fluorescence measurement from the reference signal. The processing of the measured signal and/or the reference signal may involve computation of the mean fluorescence over each of the given intervals. The reference signal acts to compensate for potential fluctuations in the optical excitation power level (and other aspects), which can cause a proportional fluctuation in the measurement and readout fluorescence measurements. Thus, in some implementations the magnetometer includes a full repolarization between measurements with a reference fluorescence intensity (e.g., the reference signal) captured prior to RF excitation (e.g., RF pulse excitation sequence) and the subsequent magnetic b field measurement data. This approach may reduce sensor bandwidth and increase measurement noise through two intensity estimates per magnetic b field measurement. For a magneto-optical defect material with defect centers magnetometer, this can mean that it needs full repolarization of the ensemble defect center states between measurements. In some instances, the bandwidth considerations provide a high laser power density trade space in sensor design, which can impact available integration time and achievable sensitivity.

In some implementations, the magnetometer system may omit a reference signal acquisition prior to RF pulse excitation sequence and measured signal acquisition. The system processes the post RF sequence read-out measurement from the measured signal directly to obtain magnetometry measurements. The processing of the measured signal may involve computation of the mean fluorescence over each of the given intervals. In some implementations, a fixed "system rail" photo measurement is obtained and used as a nominal reference to compensate for any overall system shifts in intensity offset. In some implementations, an optional ground reference signal may be obtained during the RF pulse excitation sequence to be used as an offset reference. Some implementations provide faster acquisition times, reduced or eliminated noise from the reference signal, and increased potential detune Vpp contrast.

In some implementations, an approximation of the read-out from a Ramsey pulse sequence when the pulse width is much less than the free precession interval may be shown as equation (1) below:

$$1 - e^{\frac{\tau}{T_2^*}} * \left(\frac{\omega_{res}}{\omega_{eff}}\right)^2 * \sum_{m=-1}^{1} \cos((2\pi(\Delta + m * a_n)) * (\tau + \theta)) \quad (1)$$

In equation (1) above, $\tau$ represents the free precession time, $T_2^*$ represents spin dephasing due to inhomogeneities present in the system 600, $\omega_{res}$ represents the resonant Rabi frequency, $\omega_{eff}$ represents the effective Rabi frequency, $\alpha_n$ represents the hyperfine splitting of the NV diamond material 620 (~2.14 MHz), $\Delta$ represents the MW detuning, and $\theta$ represents the phase offset.

Figure 13A:
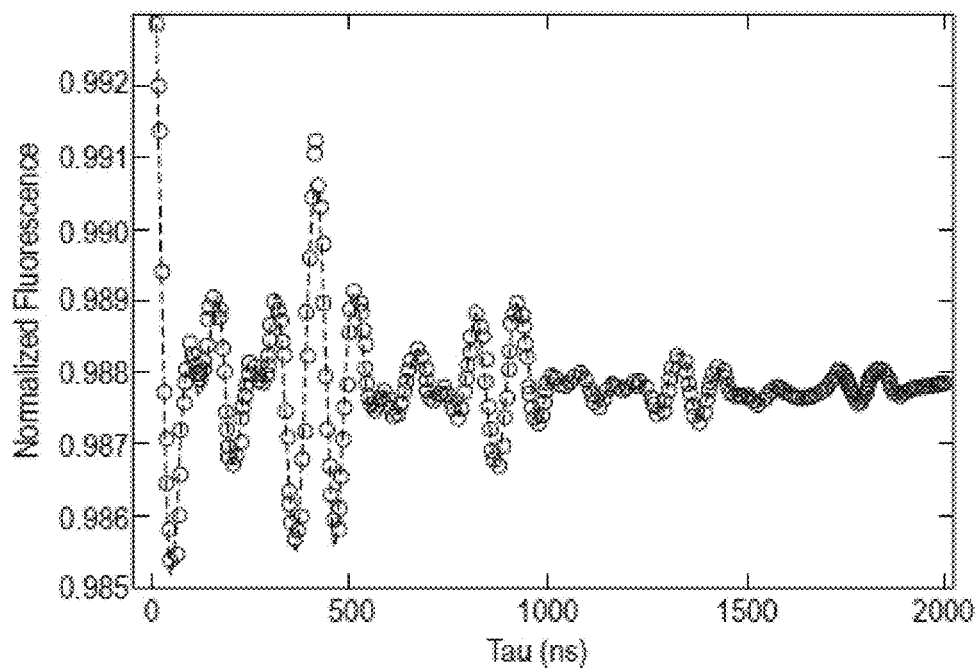
FIG. 13A is a free induction decay curve where a free precession time $\tau$ is varied using a Ramsey sequence in some implementations.
Figure 13B:
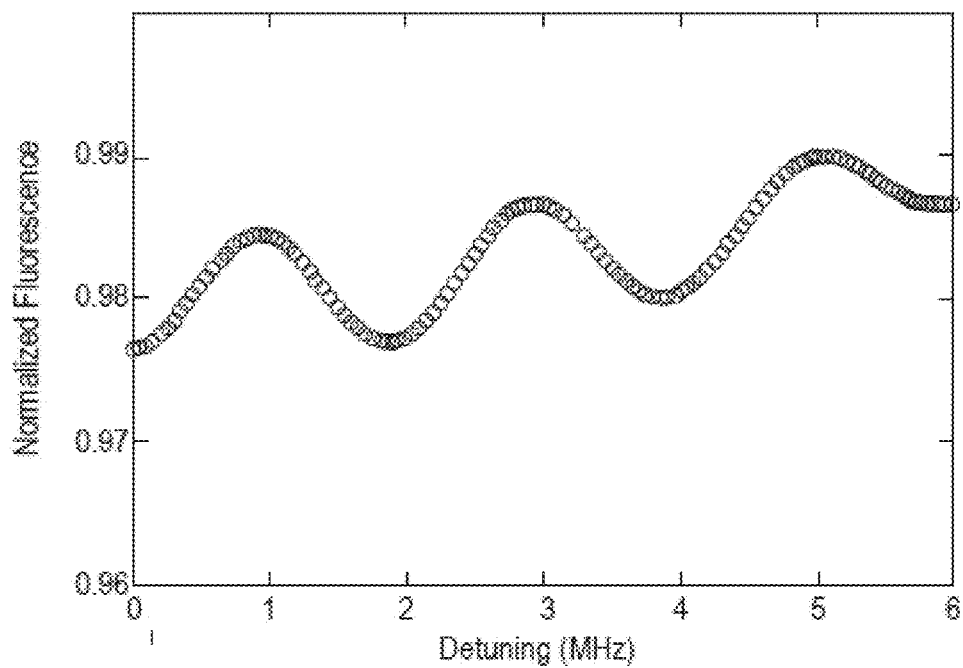
FIG. 13B is a magnetometry curve where a RF detuning frequency $\Delta$ is varied using a Ramsey sequence in some implementations.

When taking a measurement based on a Ramsey pulse sequence, the parameters that may be controlled are the duration of the MW π/2 pulses, the frequency of the MW pulse (which is referenced as the frequency amount detuned from the resonance location, $\Delta$), and the free precession time $\tau$. FIGS. 13A and 13B show the effects on the variance of certain parameters of the Ramsey pulse sequence. For example, as shown in FIG. 13A, if all parameters are kept constant except for the free precession time $\tau$, an interference pattern, known as the free induction decay (FID), is obtained. The FID curve is due to the constructive/destructive interference of the three sinusoids that correspond to the hyperfine splitting. The decay of the signal is due to inhomogeneous dephasing and the rate of this decay is characterized by $T_2^*$ (characteristic decay time). In addition, as shown in FIG. 7B, if all parameters are kept constant except for the microwave detuning $\Delta$, a magnetometry curve is obtained. In this case, the x-axis may be converted to units of magnetic field through the conversion 1 nT=28 Hz in order to calibrate for magnetometry.

Figure 14:
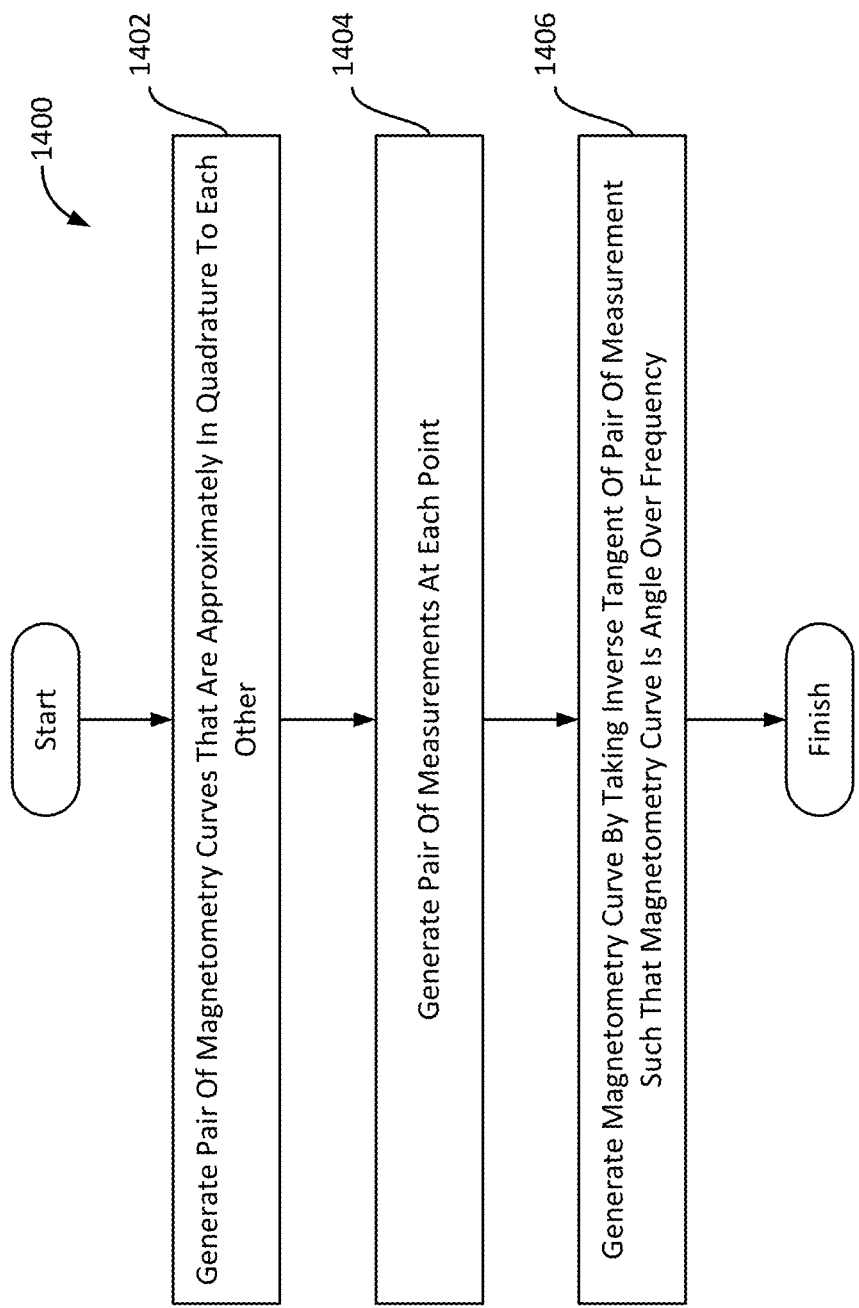
FIG. 14 includes a flow chart of a method for magnetic detection using a magneto-optical defect center material comprising a plurality of defect centers, in accordance with one or more implementations.

FIG. 14 illustrates a method 1400 for magnetic detection using a magneto-optical defect center material comprising a plurality of defect centers, in accordance with one or more implementations. The operations of method 1400 presented below are intended to be illustrative. In some implementations, method 1400 may be accomplished with one or more additional operations not described, and/or without one or more of the operations discussed. Additionally, the order in which the operations of method 1400 are illustrated in FIG. 14 and described below is not intended to be limiting.

In some implementations, method 1400 may be implemented in one or more controllers or processing devices (e.g., a digital processor, an analog processor, a digital circuit designed to process information, an analog circuit designed to process information, a state machine, and/or other mechanisms for electronically processing information). The one or more controllers or processing devices may include one or more devices executing some or all of the operations of method 1400 in response to instructions stored electronically on an electronic storage medium. The one or more processing devices may include one or more devices configured through hardware, firmware, and/or software to be specifically designed for execution of one or more of the operations of method 1400.

An operation 1402 may include generating a pair of SMAC magnetometry curves that are approximately in quadrature to each other. Operation 1402 may be performed by one or more controllers configured by machine-readable instructions in accordance with one or more implementations. For example, referring to FIG. 10*b*, a first of the pair of SMAC magnetometry curves may be for a Ramsey sequence in the case where first and second RF excitation pulses have a phase of 0° and 0° (A=0), respectively. A third and fourth RF excitation pulses have a phase of 0° and 180° (B=0), respectively. Thus, the first and second RF excitation pulses have a first phase difference of 0° and the third and fourth RF excitation pulses have a second phase difference of 180°. In this case, the difference between the second phase difference and the first phase difference is 180. A second of the pair of SMAC magnetometry curves may be for a Ramsey sequence in the case where fifth and sixth RF excitation pulses have a phase of 0° and −90° (C=0), respectively. Seventh and eighth RF excitation pulses have a phase of 0° and 90° (D=0), respectively. Thus, the fifth and sixth RF excitation pulses have a third phase difference of −90° and the seventh and eighth RF excitation pulses have a fourth phase difference of 90°. In this case, the difference between the fourth phase difference and the third phase difference is 180 and roughly in quadrature with the difference between the second phase difference and the first phase difference.

An operation 1404 may include generating a pair of measurements at each point, each from a respective magnetometry curve of the pair of magnetometry curves. Operation 1404 may be performed by one or more controllers configured by machine-readable instructions in accordance with one or more implementations. Generating the pair of measurements at each point comprises generating a pair of measurements at each point in time with the first of each respective pair of measurements from the first pair of curves (e.g., [0, 180]) and the second of each respective pair of measurements from the second pair of curves (e.g., [−90, 90]).

An operation 1406 may include generating a magnetometry curve by taking the inverse tangent of the pair of measurements at each point such that the magnetometry curve is angle over frequency. Operation 1406 may be performed by one or more controllers configured by machine-readable instructions including a module that is the same as or similar to curve generating module 110, in accordance with one or more implementations. Taking the inverse tangent of the pair off measurement may comprise calculating the inverse tangent of a first magnetometry curve of the pair and a second magnetometry curve of the pair at a plurality of frequencies. The first magnetometry curve and second magnetometry curve may be approximately in quadrature.

In an illustrative implementation, any of the operations described herein can be implemented at least in part as computer-readable instructions stored on a computer-readable memory. Upon execution of the computer-readable instructions by a processor, the computer-readable instructions can cause a node to perform the operations.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A system configured for magnetic detection using a magneto-optical defect center material comprising a plurality of defect centers, the system comprising:
   one or more hardware processors configured by machine-readable instructions to:
      apply a first Ramsey pulse sequence to the magneto-optical defect center material comprising a first pair of RF excitation pulses having a first phase difference;
      receive a first light detection signal from an optical detector based on a first optical signal emitted by the magneto-optical defect center material due to the first Ramsey pulse sequence;
      apply a second Ramsey pulse sequence to the magneto-optical defect center comprising a second pair of RF excitation pulses having a second phase difference;
      receive a second light detection signal from the optical detector based on a second optical signal emitted by the magneto-optical defect center material due to the second Ramsey pulse sequence;
      apply a third Ramsey pulse sequence to the magneto-optical defect center material comprising a third pair of RF excitation pulses having a third phase difference;
      receive a third light detection signal from the optical detector based on a third optical signal emitted by the magneto-optical defect center material due to the third Ramsey pulse sequence;
      apply a fourth Ramsey pulse sequence to the magneto-optical defect center comprising a second pair of RF excitation pulses having a fourth phase difference;
      receive a fourth light detection signal from the optical detector based on a fourth optical signal emitted by the magneto-optical defect center material due to the fourth Ramsey pulse sequence;
      develop a first magnetometry curve as a function of a RF excitation frequency based on the first light detection signal and the second light detection signal;
      develop a second magnetometry curve as a function of the RF excitation frequency based on the third light detection signal and the fourth light detection signal, wherein the second magnetometry curve is roughly in quadrature to the first magnetometry curve; and
      provide a combined magnetometry curve based on an inverse tangent of the first magnetometry curve and the second magnetometry curve at a plurality of frequencies.

2. The system of claim 1, wherein the first Ramsey pulse sequence comprises a first optical excitation pulse, the first pair of RF excitation pulses separated by a first time period, and a second optical excitation pulse to the magneto-optical defect center material, wherein the second Ramsey pulse sequence comprises a third optical excitation pulse, the second pair of RF excitation pulses separated by a second time period, and a fourth optical excitation pulse to the magneto-optical defect center material, wherein the third Ramsey pulse sequence comprises a fifth optical excitation pulse, the third pair of RF excitation pulses separated by a third time period, and a sixth optical excitation pulse to the magneto-optical defect center material, and wherein the fourth Ramsey pulse sequence comprises a seventh optical excitation pulse, the fourth pair of RF excitation pulses separated by a fourth time period, and an eight optical excitation pulse to the magneto-optical defect center material.

3. The system of claim 1 where the Ramsey pulse sequences use shifted magnetometry adaptive cancelation.

4. The system of claim 1, wherein the one or more controllers are further configured by machine-readable instructions to determine an external magnetic field acting on the magneto-optical defect center material based on the combined magnetometry curve.

5. The system of claim 1, wherein the first pair of RF excitation pulses is applied followed by the second pair of RF excitation pulses followed by the third pair of RF excitation pulse followed by the fourth pair of RF excitation pulses.

6. The system of claim 1, wherein the first and second RF excitation pulses have a phase difference of 0° and the third and fourth RF excitation pulses have a phase difference of 180°.

7. The system of claim 6, wherein the fifth and sixth RF excitation pulses have a third phase difference of −90° and the seventh and eighth RF excitation pulses have a fourth phase difference of 90°.

8. The system of claim 1, wherein a difference between the second phase difference and the first phase difference is 180°, a difference between the fourth phase difference and the third phase difference is 180°, and the two differences are roughly in quadrature.

9. A method for magnetic detection using a magneto-optical defect center material comprising a plurality of defect centers, the method comprising:
   applying a first Ramsey pulse sequence to the magneto-optical defect center material comprising a first pair of RF excitation pulses having a first phase difference;

receiving a first light detection signal from an optical detector based on a first optical signal emitted by the magneto-optical defect center material due to the first Ramsey pulse sequence;

applying a second Ramsey pulse sequence to the magneto-optical defect center comprising a second pair of RF excitation pulses having a second phase difference;

receiving a second light detection signal from the optical detector based on a second optical signal emitted by the magneto-optical defect center material due to the second Ramsey pulse sequence;

applying a third Ramsey pulse sequence to the magneto-optical defect center material comprising a third pair of RF excitation pulses having a third phase difference;

receiving a third light detection signal from the optical detector based on a third optical signal emitted by the magneto-optical defect center material due to the third Ramsey pulse sequence;

applying a fourth Ramsey pulse sequence to the magneto-optical defect center comprising a second pair of RF excitation pulses having a fourth phase difference;

receiving a fourth light detection signal from the optical detector based on a fourth optical signal emitted by the magneto-optical defect center material due to the fourth Ramsey pulse sequence;

developing a first magnetometry curve as a function of a RF excitation frequency based on the first light detection signal and the second light detection signal;

developing a second magnetometry curve as a function of the RF excitation frequency based on the third light detection signal and the fourth light detection signal, wherein the second magnetometry curve is roughly in quadrature to the first magnetometry curve; and providing a combined magnetometry curve based on an inverse tangent of the first magnetometry curve and the second magnetometry curve at a plurality of frequencies.

10. The method of claim 9, wherein the first Ramsey pulse sequence comprises a first optical excitation pulse, the first pair of RF excitation pulses separated by a first time period, and a second optical excitation pulse to the magneto-optical defect center material, wherein the second Ramsey pulse sequence comprises a third optical excitation pulse, the second pair of RF excitation pulses separated by a second time period, and a fourth optical excitation pulse to the magneto-optical defect center material, wherein the third Ramsey pulse sequence comprises a fifth optical excitation pulse, the third pair of RF excitation pulses separated by a third time period, and a sixth optical excitation pulse to the magneto-optical defect center material, and wherein the fourth Ramsey pulse sequence comprises a seventh optical excitation pulse, the fourth pair of RF excitation pulses separated by a fourth time period, and an eight optical excitation pulse to the magneto-optical defect center material.

11. The system of claim 9, where the Ramsey pulse sequences use shifted magnetometry adaptive cancelation.

12. The method of claim 9, further comprising determining an external magnetic field acting on the magneto-optical defect center material based on the combined magnetometry curve.

13. The method of claim 9, wherein the first pair of RF excitation pulses is applied followed by the second pair of RF excitation pulses followed by the third pair of RF excitation pulse followed by the fourth pair of RF excitation pulses.

14. The method of claim 10, wherein optical signals emitted by the magneto-optical defect center material due to the second and fourth optical excitation pulses are fluorescence signals.

15. The method of claim 9, wherein the first and second RF excitation pulses have a phase difference of 0° and the third and fourth RF excitation pulses have a phase difference of 180°.

16. The method of claim 9, wherein the first phase difference is about 0° and the second phase difference is about 180°.

17. The method of claim 16, wherein the fifth and sixth RF excitation pulses have a phase difference of −90° and the seventh and eighth RF excitation pulses have a phase difference of 90°.

18. A system configured for magnetic detection using a magneto-optical defect center material comprising a plurality of defect centers, the system comprising:

one or more controllers configured by machine-readable instructions to:

control an optical excitation source and an RF excitation source to apply a first pulse sequence comprising a first optical excitation pulse, a first pair of RF excitation pulses separated by a first time period, and a second optical excitation pulse to the magneto-optical defect center material;

control the optical excitation source and the RF excitation source to apply a second pulse sequence comprising a third optical excitation pulse, a second pair of RF excitation pulses separated by a second time period, and a fourth optical excitation pulse to the magneto-optical defect center material, wherein the pulse width of the first pair of RF excitation pulses is different than the pulse width of the second pair of RF excitation pulses, and wherein the first time period is different than the second time period;

control an optical excitation source and an RF excitation source to apply a third pulse sequence comprising a fifth optical excitation pulse, a third pair of RF excitation pulses separated by a third time period, and a sixth optical excitation pulse to the magneto-optical defect center material;

control the optical excitation source and the RF excitation source to apply a fourth pulse sequence comprising a seventh optical excitation pulse, a fourth pair of RF excitation pulses separated by a fourth time period, and an eighth optical excitation pulse to the magneto-optical defect center material, wherein the pulse width of the third pair of RF excitation pulses is different than the pulse width of the second pair of RF excitation pulses, and wherein the third time period is different than the fourth time period;

receive a first light detection signal from an optical detector based on a first optical signal emitted by the magneto-optical defect center material due to the first pulse sequence;

receive a second light detection signal from the optical detector based on a second optical signal emitted by the magneto-optical defect center material due to the second pulse sequence;

receive a third light detection signal from the optical detector based on a third optical signal emitted by the magneto-optical defect center material due to the third pulse sequence;

receive a fourth light detection signal from the optical detector based on a fourth optical signal emitted by the magneto-optical defect center material due to the fourth pulse sequence;

provide a first magnetometry curve as a function of a RF excitation frequency based on the first light detection signal and the second light detection signal;

provide a second magnetometry curve as a function of the RF excitation frequency based on the third light detection signal and the fourth light detection signal; and provide a combined magnetometry curve based on an inverse tangent of the first magnetometry curve and the second magnetometry curve at a plurality of frequencies, wherein the first magnetometry curve and second magnetometry curve is approximately in quadrature.

19. The system of claim 18, wherein the RF excitation frequency is associated with an axis of a defect center of the magneto-optical defect center material.

20. The system of claim 18, wherein the one or more controllers are further configured by machine-readable instructions to determine a change in an external magnetic field acting on the magneto-optical defect center material based on the combined magnetometry curve.

21. The system of claim 18, wherein the second pair of RF excitation pulses of the first pulse sequence are applied at a frequency detuned from the high resonance frequency of the magneto-optical defect center material.

22. A method for magnetic detection using a magneto-optical defect center material comprising a plurality of defect centers, the method comprising:

controlling an optical excitation source and an RF excitation source to apply a first pulse sequence comprising a first optical excitation pulse, a first pair of RF excitation pulses separated by a first time period, and a second optical excitation pulse to the magneto-optical defect center material;

controlling the optical excitation source and the RF excitation source to apply a second pulse sequence comprising a third optical excitation pulse, a second pair of RF excitation pulses separated by a second time period, and a fourth optical excitation pulse to the magneto-optical defect center material, wherein the pulse width of the first pair of RF excitation pulses is different than the pulse width of the second pair of RF excitation pulses, and wherein the first time period is different than the second time period;

controlling an optical excitation source and an RF excitation source to apply a third pulse sequence comprising a fifth optical excitation pulse, a third pair of RF excitation pulses separated by a third time period, and a sixth optical excitation pulse to the magneto-optical defect center material;

controlling the optical excitation source and the RF excitation source to apply a fourth pulse sequence comprising a seventh optical excitation pulse, a fourth pair of RF excitation pulses separated by a fourth time period, and an eighth optical excitation pulse to the magneto-optical defect center material, wherein the pulse width of the third pair of RF excitation pulses is different than the pulse width of the second pair of RF excitation pulses, and wherein the third time period is different than the fourth time period;

receiving a first light detection signal from an optical detector based on a first optical signal emitted by the magneto-optical defect center material due to the first pulse sequence;

receiving a second light detection signal from the optical detector based on a second optical signal emitted by the magneto-optical defect center material due to the second pulse sequence;

receiving a third light detection signal from the optical detector based on a third optical signal emitted by the magneto-optical defect center material due to the third pulse sequence;

receiving a fourth light detection signal from the optical detector based on a fourth optical signal emitted by the magneto-optical defect center material due to the fourth pulse sequence;

providing a first magnetometry curve as a function of a RF excitation frequency based on the first light detection signal and the second light detection signal;

providing a second magnetometry curve as a function of the RF excitation frequency based on the third light detection signal and the fourth light detection signal; and providing a combined magnetometry curve based on an inverse tangent of the first magnetometry curve and the second magnetometry curve at a plurality of frequencies, wherein the first magnetometry curve and second magnetometry curve is approximately in quadrature.

23. The method of claim 22, wherein the RF excitation frequency is associated with an axis of a defect center of the magneto-optical defect center material.

24. The method of claim 22, further comprising determining a change in an external magnetic field acting on the magneto-optical defect center material based on the combined magnetometry curve.

25. The method of claim 22, wherein the second pair of RF excitation pulses of the first pulse sequence are applied at a frequency detuned from the high resonance frequency of the magneto-optical defect center material.

26. A system for magnetic detection, comprising:
a magneto-optical defect center material comprising a plurality of defect centers;
a means of providing RF excitation to the magneto-optical defect center material;
a means of providing optical excitation to the magneto-optical defect center material;
a means of controlling the provided RF excitation and provided optical excitation to:
apply a first Ramsey pulse sequence to the magneto-optical defect center material comprising a first pair of RF excitation pulses having a first phase difference;
receive a first light detection signal from an optical detector based on a first optical signal emitted by the magneto-optical defect center material due to the first Ramsey pulse sequence;
apply a second Ramsey pulse sequence to the magneto-optical defect center comprising a second pair of RF excitation pulses having a second phase difference;
receive a second light detection signal from the optical detector based on a second optical signal emitted by the magneto-optical defect center material due to the second Ramsey pulse sequence;
apply a third Ramsey pulse sequence to the magneto-optical defect center material comprising a third pair of RF excitation pulses having a third phase difference;

receive a third light detection signal from a third optical detector based on the optical signal emitted by the magneto-optical defect center material due to the third Ramsey pulse sequence;

apply a fourth Ramsey pulse sequence to the magneto-optical defect center comprising a second pair of RF excitation pulses having a fourth phase difference;

receive a fourth light detection signal from the optical detector based on a fourth optical signal emitted by the magneto-optical defect center material due to the fourth Ramsey pulse sequence;

a means of developing magnetometry curves to:

develop a first magnetometry curve as a function of a RF excitation frequency based on the first light detection signal and the second light detection signal;

develop a second magnetometry curve as a function of the RF excitation frequency based on the third light detection signal and the fourth light detection signal, wherein the second magnetometry curve is roughly in quadrature to the first magnetometry curve; and provide a combined magnetometry curve based on an inverse tangent of the first magnetometry curve and the second magnetometry curve at a plurality of frequencies.

27. The system of claim 26, further comprising:
a means of providing a bias magnetic offset to distinguish response curves of different lattice orientation subsets of the magneto-optical defect center material.

28. The system of claim 26, wherein the first Ramsey pulse sequence comprises a first optical excitation pulse, the first pair of RF excitation pulses separated by a first time period, and a second optical excitation pulse to the magneto-optical defect center material, wherein the second Ramsey pulse sequence comprises a third optical excitation pulse, the second pair of RF excitation pulses separated by a second time period, and a fourth optical excitation pulse to the magneto-optical defect center material, wherein the third Ramsey pulse sequence comprises a fifth optical excitation pulse, the third pair of RF excitation pulses separated by a third time period, and a sixth optical excitation pulse to the magneto-optical defect center material, and wherein the fourth Ramsey pulse sequence comprises a seventh optical excitation pulse, the fourth pair of RF excitation pulses separated by a fourth time period, and an eight optical excitation pulse to the magneto-optical defect center material.

29. The system of claim 26, further comprising:
a means to determine an external magnetic field acting on the magneto-optical defect center material based on the combined magnetometry curve.

30. The system of claim 26, where the Ramsey pulse sequences use shifted magnetometry adaptive cancelation.

* * * * *